United States Patent
Haga

(10) Patent No.: US 11,476,865 B2
(45) Date of Patent: Oct. 18, 2022

(54) SENSOR DEVICE AND A/D CONVERSION METHOD

(71) Applicant: Japan Display Inc., Tokyo (JP)

(72) Inventor: Yuta Haga, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/317,892

(22) Filed: May 12, 2021

(65) Prior Publication Data

US 2021/0266005 A1    Aug. 26, 2021

Related U.S. Application Data

(63) Continuation of application No. PCT/JP2019/039855, filed on Oct. 9, 2019.

(30) Foreign Application Priority Data

Nov. 12, 2018 (JP) .............................. JP2018-212271

(51) Int. Cl.
*H03M 1/34* (2006.01)

(52) U.S. Cl.
CPC .................................. *H03M 1/34* (2013.01)

(58) Field of Classification Search
CPC .......... H04N 5/378; H03M 1/121; H03M 1/34
See application file for complete search history.

(56) References Cited

U.S. PATENT DOCUMENTS 9,521,351 B1 * 12/2016 Endsley ............... H04N 5/3532

FOREIGN PATENT DOCUMENTS

JP    2004-112077 A    4/2004

* cited by examiner

*Primary Examiner* — Patrick C Chen
(74) *Attorney, Agent, or Firm* — Xsensus LLP

(57) ABSTRACT

According to one embodiment, a sensor device includes a switch, a control circuit and an A/D converter. The switch is connected to a sensor element configured to store charge and provided to read the charge stored in the sensor element from the sensor element. The control circuit is configured to control the switch so as to partially and sequentially read the charge stored in the sensor element. The A/D converter is connected to the switch, which is configured to output a digital signal obtained by A/D-converting an analog signal according to the charge, for each charge partially read via the switch.

14 Claims, 11 Drawing Sheets

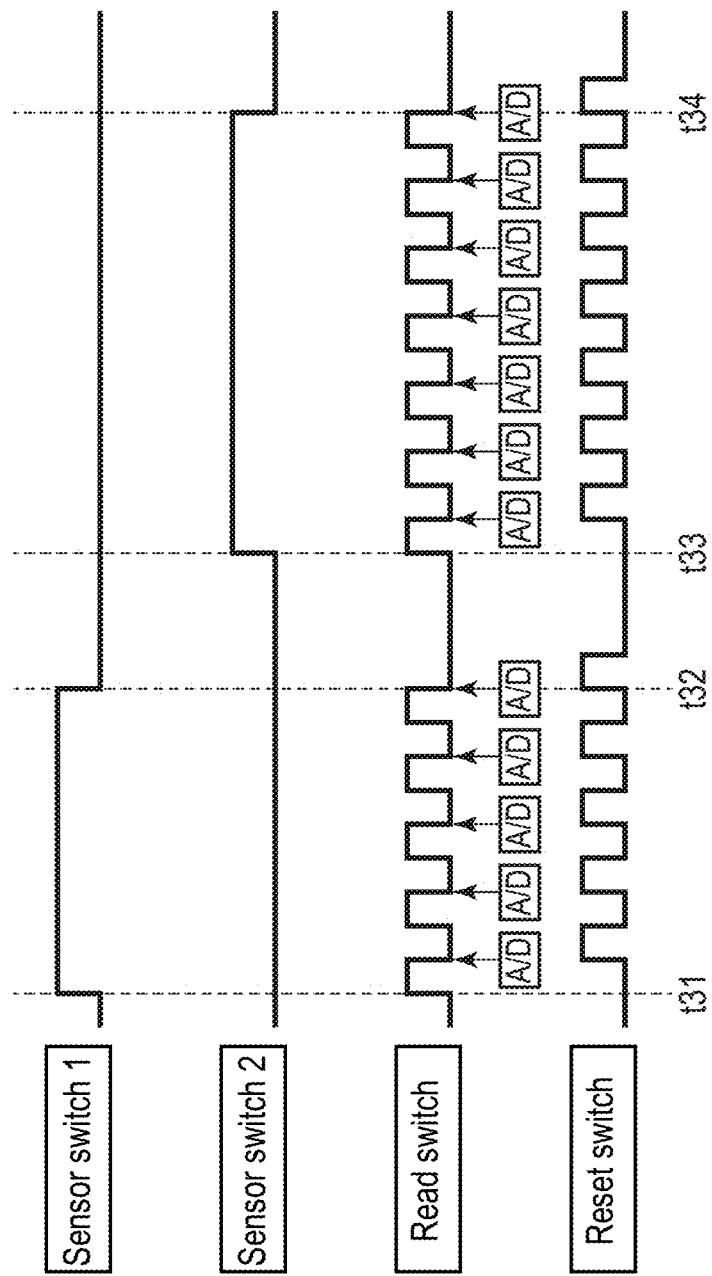
F I G. 10

SENSOR DEVICE AND A/D CONVERSION METHOD

CROSS-REFERENCE TO RELATED APPLICATIONS

This application is a Continuation Application of PCT Application No. PCT/JP2019/039855, filed Oct. 9, 2019 and based upon and claiming the benefit of priority from Japanese Patent Application No. 2018-212271, filed Nov. 12, 2018, the entire contents of all of which are incorporated herein by reference.

FIELD

Embodiments described herein relate generally to a sensor drive and an A/D conversion method.

BACKGROUND

Generally, a sensor drive circuit is connected to a sensor element including a photoelectric conversion element that generates an electric charge according to incident light, for example. Further, such a sensor drive circuit includes an A/D converter.

The electric charge generated by the photoelectric conversion element is stored in the sensor element described above, and the sensor drive circuit can convert the electric charge (an analog signal) into a digital signal by the A/D converter, which is then output. The digital signal thus output from the sensor drive circuit (A/D converter) can be used for various processes.

Here, the resolution for the charge stored in the sensor element is limited by the bit width of the operational amplifier equipped in the A/D converter. Note that there is a demand of improving the resolution.

BRIEF DESCRIPTION OF THE DRAWINGS

FIG. 10 is a diagram illustrating an example of the operation of a sensor drive circuit according to the second embodiment.

DETAILED DESCRIPTION

Figure 1:
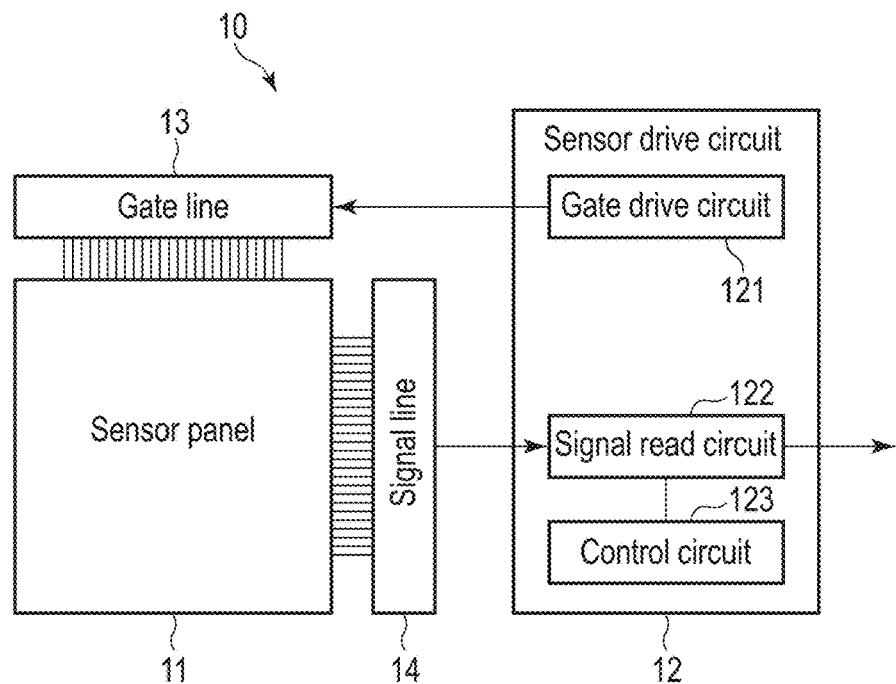
FIG. 1 is a diagram showing a schematic configuration of a sensor module according to the first embodiment.

In general, according to one embodiment, a sensor device includes a switch, a control circuit and an A/D converter. The switch is connected to a sensor element configured to store charge and provided to read the charge stored in the sensor element from the sensor element. The control circuit is configured to control the switch so as to partially and sequentially read the charge stored in the sensor element. The A/D converter is connected to the switch, which is configured to output a digital signal obtained by A/D-converting an analog signal according to the charge, for each charge partially read via the switch.

Various embodiments will be described hereinafter with reference to the accompanying drawings.

The disclosure is a mere example, and arbitrary change of gist which can be easily conceived by a person of ordinary skill in the art naturally falls within the inventive scope. To more clarify the explanations, the drawings may pictorially show width, thickness, shape and the like, of each portion as compared with an actual aspect, but they are mere examples and do not restrict the interpretation of the invention. In each drawing, reference numerals may be omitted for the same or similar elements arranged consecutively. Further, in the present specification and the drawings, elements like or similar to those in the already described drawings may be denoted by similar reference numbers and there redundant detailed descriptions may be arbitrarily omitted.

First Embodiment

First, the first embodiment will be described. FIG. 1 shows a schematic configuration of a sensor module (sensor device) according to this embodiment.

A sensor module 10 shown in FIG. 1 includes a sensor panel 11 and a sensor drive circuit 12.

On the sensor panel 11, for example, a plurality of sensor elements including photoelectric conversion elements that generate electric charges according to light (incident light) irradiated to a screen (panel) are arranged in a matrix, for example. It should be noted that each of the plurality of sensor elements arranged on the sensor panel 11 is configured to be able to store the charge generated by the photoelectric conversion element included in the sensor element.

The sensor panel 11 (each of the plurality of sensor elements arranged on the sensor panel 11) is electrically connected to a sensor drive circuit 12 via a gate line 13 and a signal line 14.

The sensor drive circuit 12 is a circuit configured to read the electric charge stored in the above-mentioned sensor element from the sensor element and output an electric signal according to the read electric charge. The sensor drive circuit 12 includes a gate drive circuit 121, a signal read circuit 122 and a control circuit 123.

The gate drive circuit 121 is connected to each of a plurality of sensor elements arranged on the sensor panel 11 via a gate line 13. The gate drive circuit 121 is a circuit configured to drive a sensor switch included in the sensor element in order to read the electric charge stored in the sensor element.

The signal read circuit 122 is a circuit configured to read a charge from each of the plurality of sensor elements arranged on the sensor panel 11 and output a digital signal obtained by A/D-converting an analog signal according to the charge.

The control circuit 123 is a circuit configured to control the reading of charges from the sensor elements by the signal read circuit 122.

Figure 2:
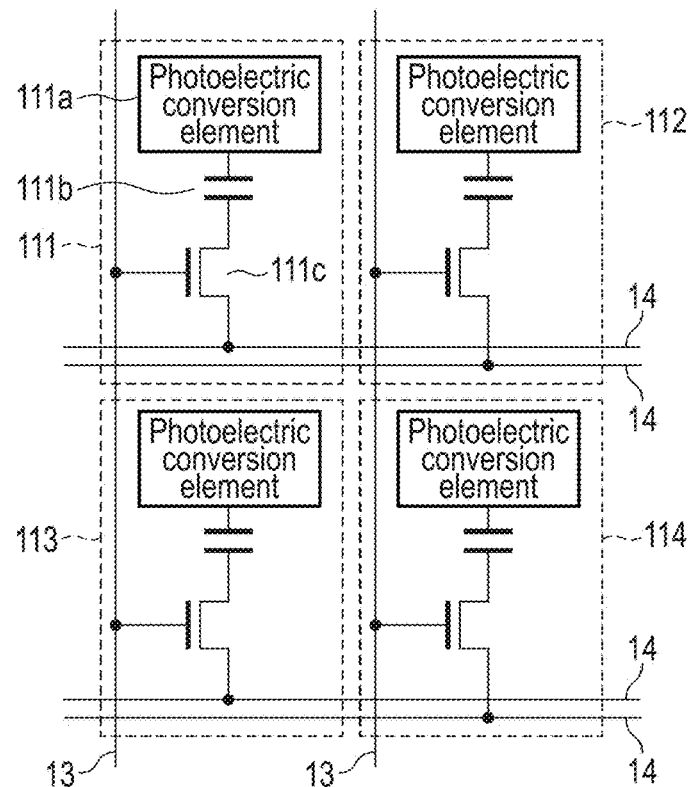
FIG. 2 is a diagram showing an example of a circuit configuration of a sensor panel.

FIG. 2 shows an example of a circuit configuration of the sensor panel 11 shown in FIG. 1. As described above, the sensor panel 11 includes a plurality of sensor elements arranged in a matrix. Note that, in FIG. 2, only four sensor elements 111 to 114 are shown for convenience.

The configuration of the sensor element 111 of the four sensor elements 111 to 114 shown in FIG. 2 will be described below.

The sensor element 111 includes a photoelectric conversion element 111a, a charge holding capacitor (a sensor pixel capacitor) 111b and a sensor switch 111c.

The photoelectric conversion element 111a is an element configured to generate an electric charge according to light irradiated onto the sensor panel 11 as described above. For example, a photodiode or the like is used as the photoelectric conversion element 111a, but the photoelectric conversion element 111a may be any other element as long as it generates an electric charge according to incident light. Further, the photoelectric conversion element 111a may not necessarily be a single element, but, for example, a plurality of photoelectric conversion elements may be bundled into one sensor element.

The charge storage capacitor 111b is a capacitor (condenser) configured to store the charge generated in the photoelectric conversion element 111a, and is electrically connected to the photoelectric conversion element 111a.

The sensor switch 111c includes a thin film transistor (TFT). The sensor switch 111c is located, for example, near the intersection of a gate line 13 (sensor gate line) extending along a column in which a plurality of sensor elements are arranged, and a signal line 14 (sensor signal line) extending along a row in which the plurality of sensor elements are arranged.

A gate electrode of the sensor switch 111c is electrically connected to a corresponding gate line 13. A source electrode of the sensor switch 111c is electrically connected to a corresponding signal line 14. A drain electrode of the sensor switch 111c is electrically connected to the charge storage capacitor 111b. Note that the drain electrode of the sensor switch 111c may be connected to the signal line 14 and the source electrode of the sensor switch 111c may be connected to the charge storage capacitor 111b.

Here, as described above, the gate line 13 is connected to a gate drive circuit 121 included in the sensor drive circuit 12. Further, the signal line 14 is connected to a signal read circuit 122 included in the sensor drive circuit 12.

The gate drive circuit 121 applies an on-voltage to gate lines 13 sequentially to supply the on-voltage to the gate electrode of the sensor switch 111c electrically connected to the gate line 13. When the on-voltage is supplied to the gate electrode of a sensor switch 111c, the source electrode and the drain electrode of the sensor switch 111c are electrically connected.

Thus, the charge stored in the charge storage capacitor 111b (that is, the charge generated in the photoelectric conversion element 111a) is output via the signal line 14, and the signal read circuit 122 connected to the signal line 14 can read the charge.

Here, only the configuration of the sensor element 111 has been described, but the other sensor elements (the sensor elements 112 to 114) have a configuration similar thereto.

Figure 3:
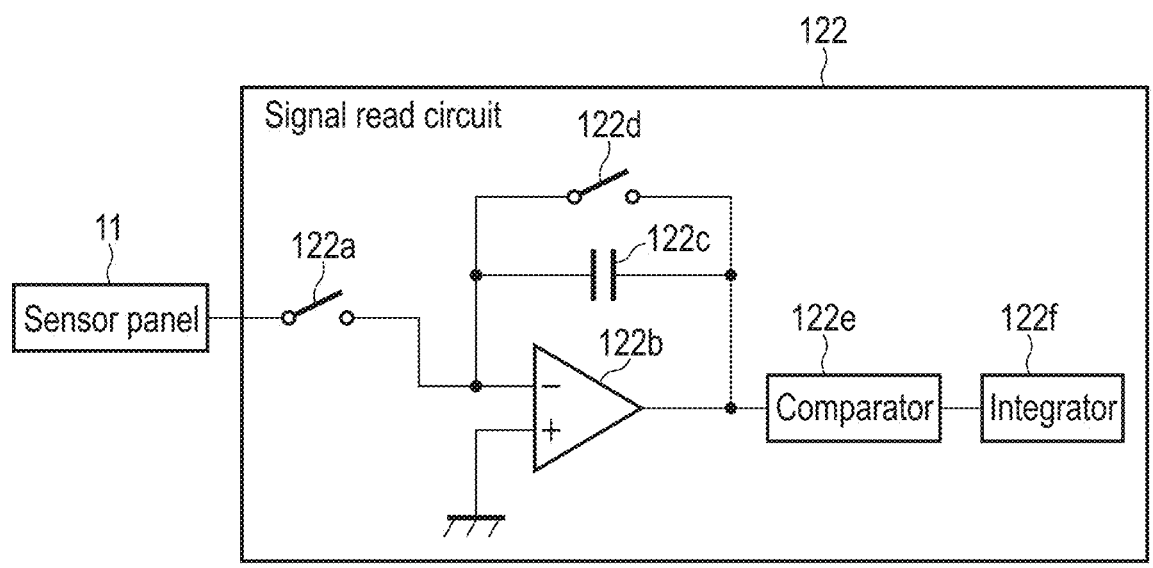
FIG. 3 is a diagram showing an example of a configuration of a signal read circuit included in a sensor drive circuit.

FIG. 3 shows an example of the configuration of the signal read circuit 122 provided in the sensor drive circuit 12. The signal read circuit 122 includes a read switch 122a, an operational amplifier 122b, a feedback capacitor 122c, a reset switch 122d, a comparator 122e and an integrator 122f.

The read switch 122a is connected to each of the sensor elements arranged on the sensor panel 11, and is provided to read the electric charge stored in the respective sensor element (charge holding capacitor) from the sensor element.

The read switch 122a switches a state in which a charge can be read from a sensor element (an ON state) and a state in which the reading of charges from the sensor elements is stopped (an Off state) based on the control by the control circuit 123 provided in the sensor drive circuit 12.

Note that a plurality of sensor elements are arranged on the sensor panel 11, and sensor elements whose electric charge are read by the signal readout circuit 122 via the read switch 122a are sensor elements provided with sensor switches in which the on-voltage is being applied to the gate electrode thereof by the gate drive circuit 121 described above. In other words, the sensor elements whose charges are read by the signal read circuit 122 are sequentially selected by the gate driving circuit 121 that applies the on-voltage to the gate lines.

The operational amplifier 122b includes a non-inverting input terminal (+), an inverting input terminal (−) and an output terminal. A reference voltage is input to the non-inverting input terminal, and the read switch 122a is electrically connected to the inverting input terminal.

Further, a feedback capacitor 122c is connected between the inverting input terminal and the output terminal of the operational amplifier 122b to form a negative feedback circuit. Note that the operational amplifier 122b and the feedback capacitor 122c described above are equivalent to an integrator (integration circuit).

The reset switch 122d is connected in parallel to the feedback capacitor 122c. In the signal read circuit 122, the integrator described above can be reset by setting the reset switch 122d in the ON state.

The comparator 122e is electrically connected to the output terminal of the operational amplifier 122b and compares the output signal of the operational amplifier 122b with a comparison signal.

In this embodiment, the operational amplifier 122b, the feedback capacitor 122c, the reset switch 122d and the comparator 122e, described above constitute an A/D converter configured to A/D-convert analog signals and output digital signals.

Let us suppose that a sensor drive circuit having a configuration that the signal read circuit 122 includes an operational amplifier 122b, a feedback capacitor 122c, a reset switch 122d and a comparator 122e (that is, it does not include an integrator 122f) is used as a comparative example of this embodiment. Now, with reference to FIG. 4, an example of the operation of the sensor drive circuit according to the comparative example will be described.

Here, the operation will be described in connection with the case where, of the plurality of the sensor elements arranged on the sensor panel 11, charges are read sequentially from a sensor element which includes a sensor switch 1 (which will be referred to as a first sensor element, hereinafter) and a sensor element which includes a sensor switch 2 (which will be referred to as a second sensor element, hereinafter).

Figure 4:
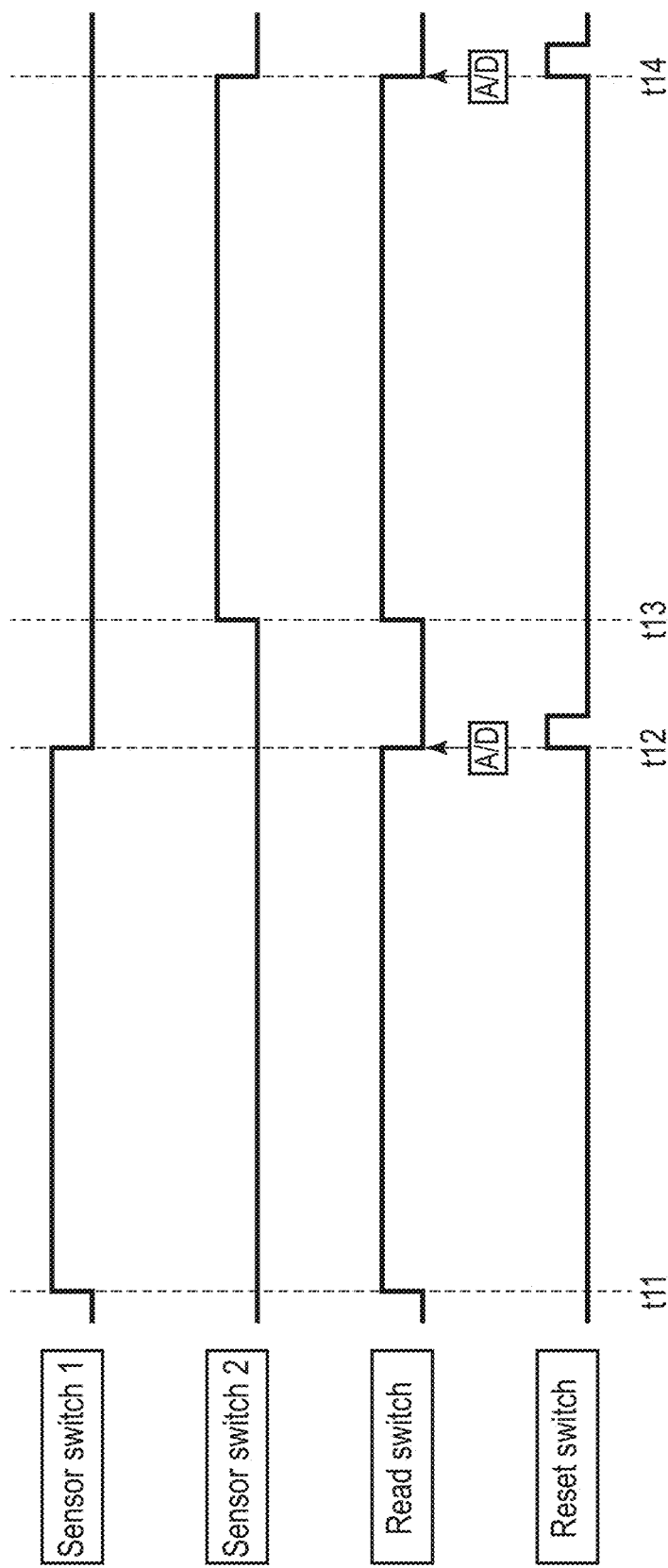
FIG. 4 is a diagram illustrating an example of the operation of the sensor drive circuit in a comparative example of the first embodiment.

First, when the charge is read from the first sensor element, at a time t11 indicated in FIG. 4, the gate drive circuit 121 supplies the on-voltage to the gate electrode of the sensor switch 1 to electrically connect between the source electrode and the drain electrode of the sensor switch 1. Further, at the time t11, the read switch 122*a* is set in the ON state.

Thus, the electric charge stored in the first sensor element (the charge holding capacitor provided in the first sensor element) can be input to the signal read circuit 122 via the sensor switch 1 and the read switch 122*a*, and the reading of the charge is started.

Then, at a time t12, the reading of the charge from the first sensor element is finished. In this case, the supply of the on-voltage to the gate electrode of the sensor switch 1 is stopped and the read switch 122*a* is set in an OFF state (that is, the reading of the charge from the first sensor element is stopped). The time t12 is assumed to be a time at which a time period during which the entire charge can be read from the first sensor element is added to the time t11.

Note that the charge read from the first sensor element is converted into a digital signal by the A/D converter. Thus, the digital signal obtained by A/D-converting the analog signal according to the charge read from the first sensor element is output from the A/D converter.

When the above-described A/D conversion is completed, the reset switch 122*d* is set in the ON state and thus the integrator is reset. When the reset of the integrator is completed, the reset switch 122*d* is set in an OFF state.

Next, when the charge is read from the second sensor element, at a time t13, the gate drive circuit 121 supplies the on-voltage to the gate electrode of the sensor switch 2 so as to electrically connect between the source electrode and the drain electrode of the sensor switch 2. Further, at a time t13, the read switch 122*a* is set in the ON state.

Thus, the charge stored in the second sensor element (the charge holding capacitor provided in the second sensor element) can be input to the signal read circuit 122 via the sensor switch 2 and the read switch 122*a*, and the reading of the charge is started.

Then, at a time t14, the reading of the charge from the second sensor element is finished. In this case, the supply of the on-voltage to the gate electrode of the sensor switch 2 is stopped and the read switch 122*a* is set in the OFF state (that is, the reading of the charge from the second sensor element is stopped). The time t14 is assumed to be a time at which a time period during which the entire charge can be read from the second sensor element is added to the time t13.

Note that the charge read from the second sensor element is converted into a digital signal by the A/D converter. Thus, the digital signal obtained by A/D-converting an analog signal according to the charge read from the second sensor element is output from the A/D converter.

When the above-described A/D conversion is completed, the reset switch 122*d* is set in the ON state and thus the integrator is reset. When the reset of the integrator is completed, the reset switch 122*d* is set in the OFF state.

Here, the case where the electric charges are read from the first sensor element and the second sensor element has been described, but the electric charges are similarly read from the other sensor elements.

Here, in the comparative example of this embodiment, for example, the entire charge stored in the first sensor element is read, and the read charge (analog signal) is A/D-converted by the A/D converter. But, the resolution for this charge (which will be referred to as an A/D resolution, hereinafter) is limited by the bit width of the operational amplifier that constitutes the A/D converter.

Here, in order to an output digital signal highly accurate with respect to the charge stored in the sensor element, it is necessary to improve the above-described A/D resolution.

Therefore, this embodiment has such a configuration that the control circuit 123 controls the read switch 122*a* so as to partially and sequentially read the charge stored in the sensor element.

In the case of such a configuration, the A/D converter outputs a digital signal obtained by A/D-converting an analog signal corresponding to a charge each time the charge partially read by the read switch 122*a* under the control of the control circuit 123.

Here, in this embodiment, the signal read circuit 122 includes an integrator 122*f* electrically connected to the A/D converter (comparator) as shown in FIG. 3.

The integrator 122*f* integrates digital signals output from the A/D converter, each obtained from each respective charge partially read as described above, and outputs it.

Hereinafter, with reference to FIG. 5, an example of the operation of the sensor drive circuit in this embodiment (the operation of reading the charge from the sensor element) will be described. Here, as in the case described with reference to FIG. 4, the operation will be described in connection with the case where, of a plurality of sensor elements arranged on the sensor panel 11, charges are sequentially read from the first sensor element including the sensor switch 1 and the second sensor element including the sensor switch 2.

Figure 5:
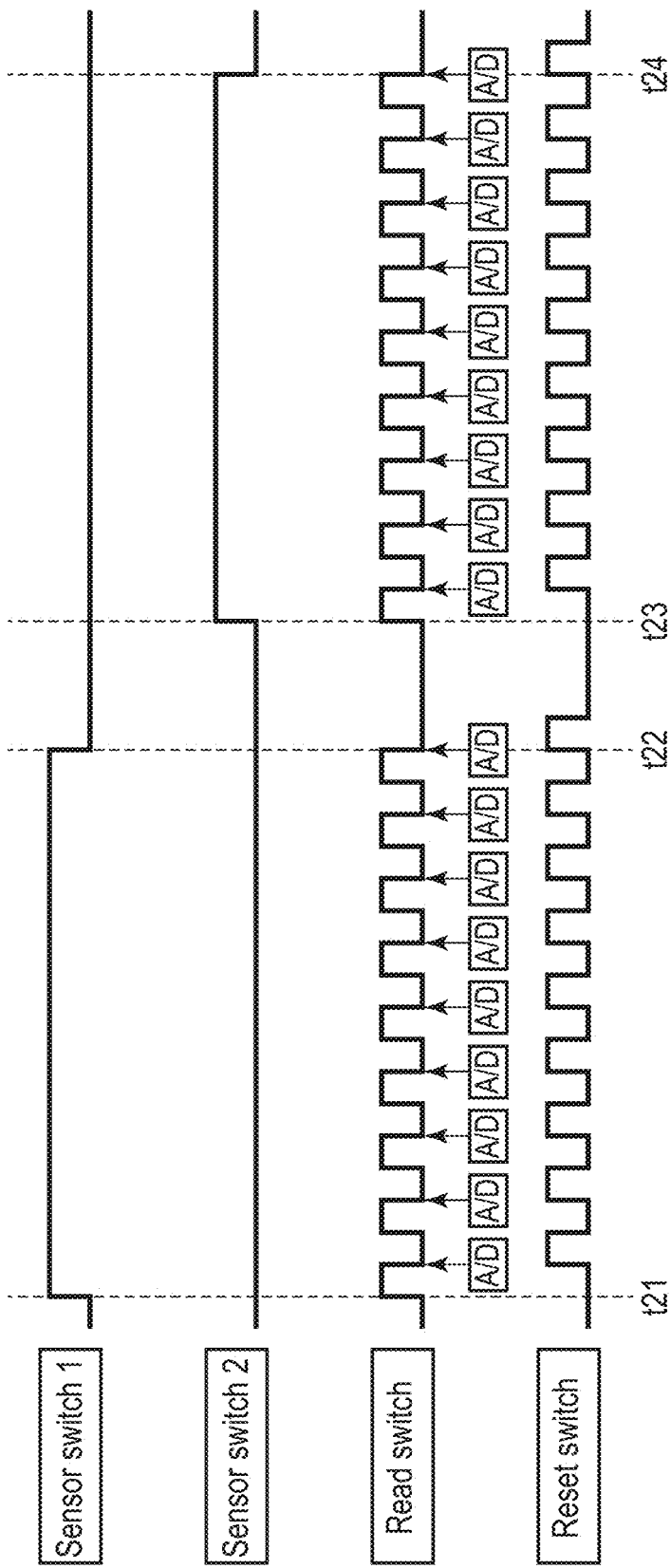
FIG. 5 is a diagram illustrating an example of the operation of the sensor drive circuit in the first embodiment.

First, when the charge is read from the first sensor element, at a time t21 shown in FIG. 5, the gate drive circuit 121 supplies an on-voltage to the gate electrode of the sensor switch 1, so as to electrically connect the source electrode and the drain electrode of the sensor switch 1. Further, at the time t21, the read switch 122*a* is set in an ON state.

Thus, the charge stored in the first sensor element (the charge holding capacitor provided in the first sensor element) can be input to the signal read circuit 122 via the sensor switch 1 and the read switch 122*a*, and the reading of the charge is started.

Here, in the above-described comparative example of this embodiment, when the reading of the charge stored in the first sensor element is started, the read switch 122*a* is maintained in the ON state until the entire charge is read. But, according to this embodiment, the control circuit 123 temporarily set the read switch 122*a* in the OFF state when a part of the charge is read. Note that the control circuit 123 sets the read switch 122*a* in the OFF state, for example, at time intervals shorter than the time in which the entire charge stored in the first sensor element is read, after the read switch 122*a* is set in the ON state.

A part of the electric charge stored in the first sensor element thus read (that is, the partially read electric charge) is converted into a digital signal by the A/D converter. Thus, a digital signal obtained by A/D-converting an analog signal according to the electric charge partially read from the first sensor element is output from the A/D converter.

When the above-described A/D conversion is completed, the reset switch 122*d* is set in the ON state and thus the integrator is reset. When the reset of the integrator is completed, the reset switch 122*d* set in the OFF state.

Next, the control circuit 123 sets the read switch 122*a* in the ON state again, and sets the read switch 122*a* in the OFF state again at the time intervals described above. Thus, a part of the charge stored (remaining) in the first sensor element is read again.

In this embodiment, a series of operations including partial read-out of electric charges from the first sensor element, the A/D conversion with respect to the charges and the resetting of the integrator are repeated until the time in when the entire charge stored in the first sensor element can be read elapses.

More specifically, in the example shown in FIG. 5, when the time reaches the point t22, the reading from the first sensor element is finished, the charge finally read from the first sensor element is A/D-converted, and the integrator is reset. Thus, the operation of reading the charge from the first sensor element is completed.

Note that the digital signals output from the A/D converter during the operation of reading the charge from the first sensor element (that is, the digital signals obtained by A/D-converting analog signals each according to the respective charge partially read from the first sensor element) are integrated by the integrator 122f. In this embodiment, the result thus integrated by the integrator 122f is output as a result of the A/D conversion with respect to the charge stored in the first sensor element.

Next, when the charge is read from the second sensor element, at a time t23, the gate drive circuit 121 supplies an on-voltage to the gate electrode of the sensor switch 2 so as to electrically connect between the source electrode and the drain electrode of the sensor switch 2. Further, at the time t23, the read switch 122a is set in the ON state.

Thus, the charge stored in the second sensor element (the charge holding capacitor provided in the second sensor element) can be input to the signal read circuit 122 via the sensor switch 2 and the read switch 122a, and the reading of the charge is started.

Note that the operation after the reading of the charge from the second sensor element is started is similar to the above-described operation after the reading of the charge from the first sensor element is started. That is, a series of operations including partial read out of electric charge from the second sensor element, the A/D conversion with respect to the charges and the resetting of the integrator are repeated until the time in when the entire charge stored in the second sensor element can be read elapses.

More specifically, as shown in FIG. 5, when the time reaches a point t24, the reading from the second sensor element is finished, and the charge finally read from the second sensor element is A/D-converted, and the integrator is rest. Thus, the operation of reading the charge from the second sensor element is completed.

Note that digital signals output from the A/D converter during the operation of reading the charge from the second sensor element (that is, digital signals obtained by A/D converting analog signals according to the charges partially read from the second sensor element) are integrated by the integrator 122f. In this embodiment, the result thus integrated by the integrator 122f is output as the result of the A/D conversion with respect to the charge stored in the second sensor element.

Here, the case where the electric charges are read from the first sensor element and the second sensor element is described, but the electric charges are similarly read from the other sensor elements.

Further, the time interval from the time t21 to the time t24 shown in FIG. 5 may be identical to or different from the time interval from the time t11 to the time t14 shown in FIG. 4.

As described above, in the present embodiment, the read switch 122a is controlled so as to partially read the charge stored in the sensor element sequentially, and for each charge partially read through the read switch 122a, a digital signal obtained by A/D-converting an analog signal according to the charge are output. With the configuration, it is possible to improve the resolution (A/D resolution) for the charge stored in the sensor element.

The principle which can be improve the above-described A/D resolution by the configuration of this embodiment will be briefly described. Here, for convenience of explanation, it is assumed that the bit width of the operational amplifier 122b included in the A/D converter is 3 bits.

Figure 6:
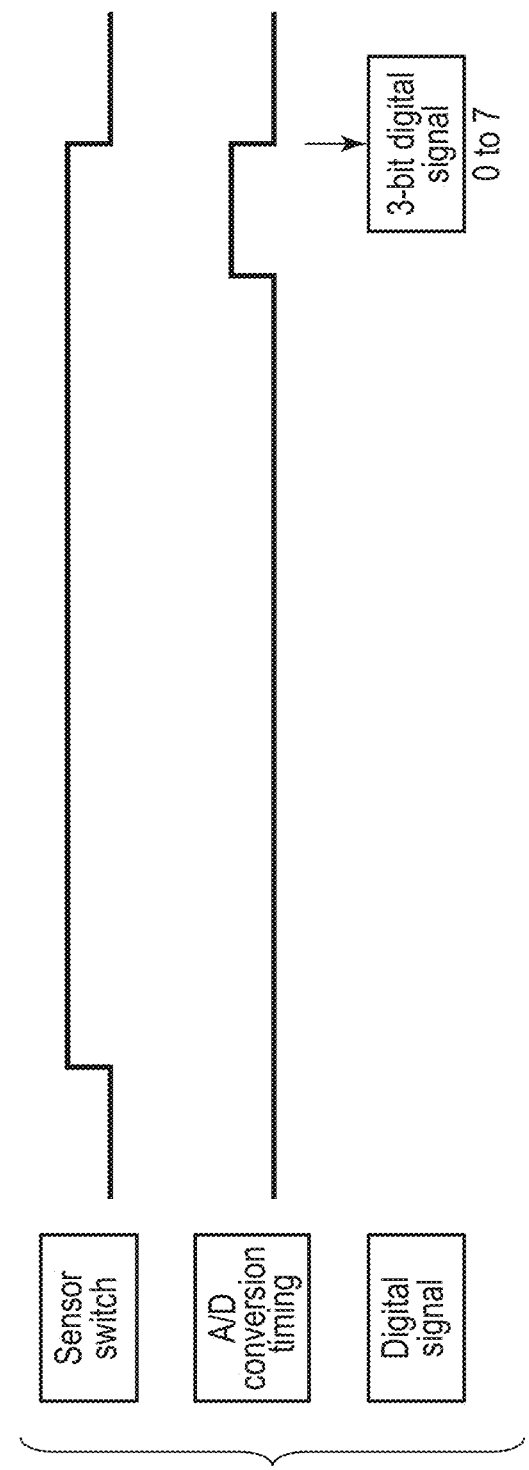
FIG. 6 is a diagram illustrating A/D resolution in the comparative example of the first embodiment.

First, the A/D resolution in the sensor drive circuit according to a comparative example of this embodiment will be described with reference to FIG. 6. FIG. 6 shows a relationship between a timing (a gate clock) at which an on-voltage is supplied to the gate electrode of the sensor switch, a timing for A/D converting an analog signal according to a charge read from the sensor element including the sensor switch and a digital signal output as a result of the A/D conversion in the comparative example of this embodiment.

As shown in FIG. 6, in the comparative example of this embodiment, the number of times of A/D conversion carried out on the charges read from the sensor element is 1, and the A/D resolution is limited by the bit width of the operational amplifier provided in the A/D converter. That is, in the comparative example of this embodiment, it is possible to obtain a 3-bit digital signal that can represent the charge stored in a sensor element on a scale of 0 to 7.

Figure 7:
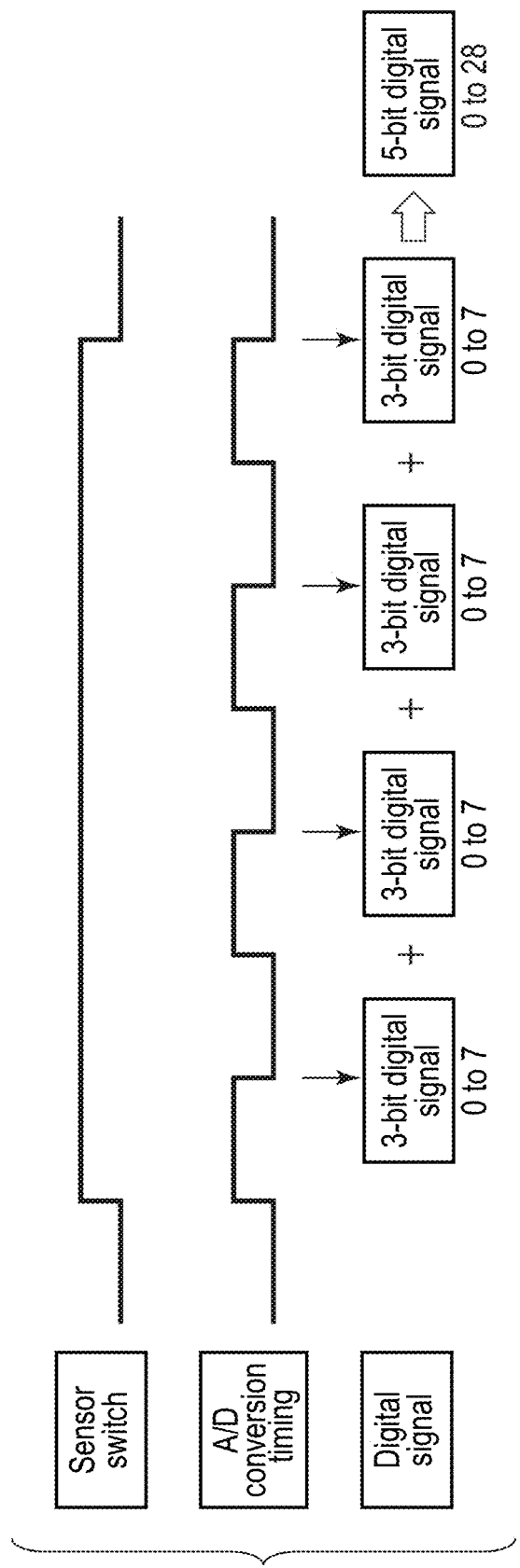
FIG. 7 is a diagram illustrating the A/D resolution in the first embodiment.

Next, with reference to FIG. 7, the A/D resolution in this embodiment will be described. FIG. 7 shows a relationship between a timing (a gate clock) at which an on-voltage is supplied to the gate electrode of the sensor switch, a timing for A/D converting an analog signal according to a charge read from the sensor element including the sensor switch and a digital signal output as a result of the A/D conversion in this embodiment.

As shown in FIG. 7, in this embodiment, the A/D conversion is carried out for each charge partially read from the sensor element. Further, in this embodiment, the results (3-bit digital signals) of the A/D conversion carried out for the partially read charges per each are integrated by the integrator 122f.

In the example shown in FIG. 7, the number of times of A/D conversion carried out on the charges read from the sensor element is 4, and the results of the A/D conversions are integrated. According to this, as a result of the A/D conversion with respect to the charge stored in the sensor element, a 5-bit digital signal which can express the charge on a scale of 0 to 28 can be obtained.

Figure 8:
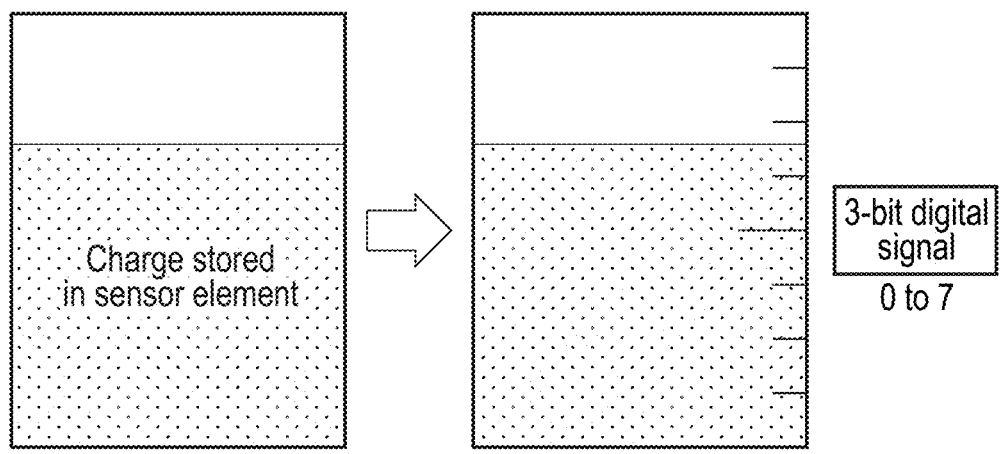
FIG. 8 is a diagram conceptually showing a digital signal that can be obtained in a comparative example of the first embodiment.

Here, FIG. 8 is a diagram conceptually showing a digital signal that can be obtained in the comparative example of this embodiment (that is, an A/D resolution in the comparative example of this embodiment). On the other hand, FIG. 9 is a diagram conceptually showing a digital signal that can be obtained in this embodiment (that is, an A/D resolution in this embodiment).

Figure 9:
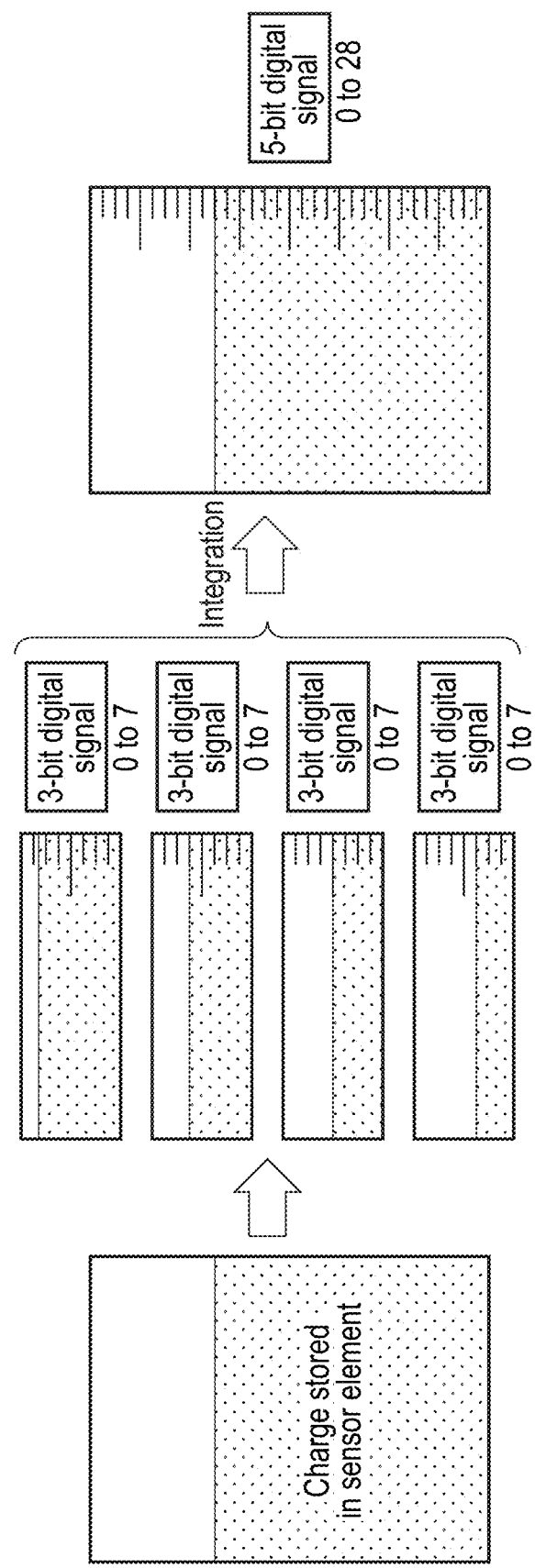
FIG. 9 is a diagram conceptually showing a digital signal that can be obtained in the first embodiment.

As shown in FIG. 8, in the comparative example of this embodiment, a 3-bit digital signal can be obtained with respect to the charge stored in the sensor element, whereas as shown in FIG. 9, in this embodiment, a substantially 5-bit digital signal with respect to the charge can be obtained.

That is, in this embodiment, a higher A/D resolution can be realized as compared to that of the comparative example of this embodiment.

Here, in the comparative example of this embodiment, the A/D resolution is limited by the bit width of the operational amplifier, whereas in the present embodiment, the A/D resolution is effectively increased to "the bit width of the operational amplifier+$\log_2$ (Number of Times of A/D conversion)". As described above, when the bit width of the operational amplifier 122b is 3 bits and the number of times of A/D conversion (the number of times of integration) is 4, the A/D resolution is 5 bits (3+log$_2$ (4)=5 bits) as described with reference to FIG. 7.

Further, let us suppose, for example, that the operational amplifier 122b has a bit width of 10 bits and the number of times of A/D conversion (the number of times of integration) is 64. In this case, the A/D resolution in the comparative example of this embodiment is 10 bits, whereas the A/D resolution in the present embodiment is effectively 16 bits (8+log$_2$ (64)=16 bits).

As described above, in this embodiment, it is possible to improve the resolution with respect to the charge stored in the sensor element.

Note that this embodiment is described in connection with the case where the sensor element includes photoelectric conversion elements, but this embodiment can be applied to other types as long as they read a charge from a sensor element which can store the charge. That is, the sensor elements according to this embodiment may be those other than the sensor element including photoelectric conversion elements.

Second Embodiment

Next, the second embodiment will be described. The configurations and the like of the sensor module, the sensor panel and the sensor drive circuit of this embodiment are the same as those in the first embodiment described above, and therefore this embodiment will be described with reference to FIGS. 1 to 3. Here, differences from those of the first embodiment described above will be mainly described.

This embodiment is different from the first embodiment described above in that the number of times of A/D conversion (that is, the number of times of integration) carried out in the operation of reading the charge from the sensor element can be changed according to the charge (the amount of charge) stored in the sensor element.

Hereinafter, with reference to FIG. 10, an example of the operation of the sensor drive circuit 12 (the operation of reading the charge from the sensor element) in this embodiment will be described. Here, the operation will be described in connection with the case where charges are sequentially read from the first sensor element including the sensor switch 1 and the second sensor element including the sensor switch 2 of a plurality of sensor elements arranged on the sensor panel 11.

First, when the charge is read from the first sensor element, at a time t31 shown in FIG. 10, the gate drive circuit 121 supplies an on-voltage to the gate electrode of the sensor switch 1 so as to electrically connect the source electrode and the drain electrode of the sensor switch 1. Further, at the time t31, the read switch 122a is set in the ON state.

Thus, the charge stored in the first sensor element (the charge holding capacitor provided in the first sensor element) can be input to the signal read circuit 122 via the sensor switch 1 and the read switch 122a, and the reading of the charge is started.

In this embodiment, the control circuit 123, as in the above-described first embodiment, sets the read switch 122a in the OFF state, for example, at time intervals shorter than the time in which the entire charge stored in the first sensor element is read, after the read switch 122a is set in the ON state.

A part of the charge stored in the first sensor element thus read (that is, the partially read electric charge) is converted into a digital signal by the A/D converter.

When the above-described A/D conversion is completed, the integrator is reset by setting the reset switch 122d in the ON state. When the reset of the integrator is completed, the reset switch 122d is set in the OFF state.

Here, the control circuit 123 in this embodiment determines whether or not to continue the operation of reading the charge from the first sensor element based on a digital signal output from the A/D converter when the above-described A/D conversion is carried out (that is, a digital signal obtained by A/D-converting an analog signal corresponding to charge partially read from the first sensor element).

More specifically, for example, when the value of the digital signal output from the A/D converter is not less than or equal to a predetermined value, the control circuit 123 recognizes that the charge to be read remains in the first sensor element, and determines to continue the operation of reading the charge from the first sensor element. When it is determined by the control circuit 123 that the operation of reading the charge from the first sensor element should be continued, the control circuit 123 set the read switch 122a in the ON state again and thus the read operation is continued.

On the other hand, for example, when the value of the digital signal as a result of the A/D conversion is less than or equal to a predetermined value, the control circuit 123 recognizes that there is no charge to be read remaining in the first sensor element and determines that the operation of reading the charge from the first sensor element is not continued (that is, finished). When it is determined by the control circuit 123 that the operation of reading the charge from the first sensor element is not continued, the operation of reading the charge from the first sensor element is completed, and the operation shifts to the operation of reading the charge from the second sensor element. In this case, the control circuit 123 notifies the gate drive circuit 121, for example, to shift to the operation of reading the charge from the second sensor element, and thus the source electrode and the drain electrode of the sensor switch 2 provided in the second sensor element are connected to each other, and the control of setting the read switch 122a in the ON state is executed.

In this embodiment, a series of operations including the partial read out of charge from the first sensor element, the A/D conversion with respect to the charge, the resetting of the integrator and the determination of whether or not to continue the read operation are performed are repeated until it is determined that the read operation should not be continued.

FIG. 10 illustrates the case where it is determined that the operation of reading the charge from the first sensor element should not be continued based on a digital signal obtained by A/D-converting an analog signal according to the charge read from the first sensor element when the time reaches a point t32.

Note that the point where the digital signals output from the A/D converter during the operation of reading the charge from the first sensor element are integrated by the integrator 122f is similar to that of the first embodiment described above.

When the operation of reading the charge from the first sensor element is completed, the operation of reading the charge from the second sensor element is started. But the operation of reading the charge from the second sensor element is similar to the operation of reading the charge from the first sensor element, and therefore a detailed description thereof is omitted here. A time t33 and a time t34 shown in FIG. 10 in the operation of reading the charge from the second sensor element correspond to the time t31 and the time t32 in the operation of reading the charge from the first sensor element.

In the example shown in FIG. 10, the A/D conversion is carried out five times in the operation of reading the charge from the first sensor element, whereas in the operation of reading the charge from the second sensor element, the A/D conversion is carried out seven times. Thus, in this embodiment, the number of times of A/D conversion (that is, the number of times of integration) can be changed according to the charge (the amount of charge) stored in the first sensor element and the charge (the amount of charge) stored in the second sensor element.

That is, as described above, this embodiment has a configuration that the readout switch 122a is controlled based on the digital signal obtained by A/D-converting the analog signal according to the partially read charge.

Here, the time period from the time t31 to the time t32 shown in FIG. 10 (the time when the reading of the charge from the first sensor element is completed) is shorter than the time period from the time t21 to the time t22 shown in FIG. 5 described in the first embodiment provided above.

That is, in this embodiment, with the above-described configuration, it is possible to avoid such a situation that the operation of reading the charge from the sensor element is continued even if the charge to be read no longer remains in the sensor element, and to shorten the operation time.

Further, in this embodiment, the number of times of A/D conversion (that is, the number of integrations) can be reduced, and therefore it is expected that noise components that may be generated by the A/D conversion can be suppressed.

Figure 11:
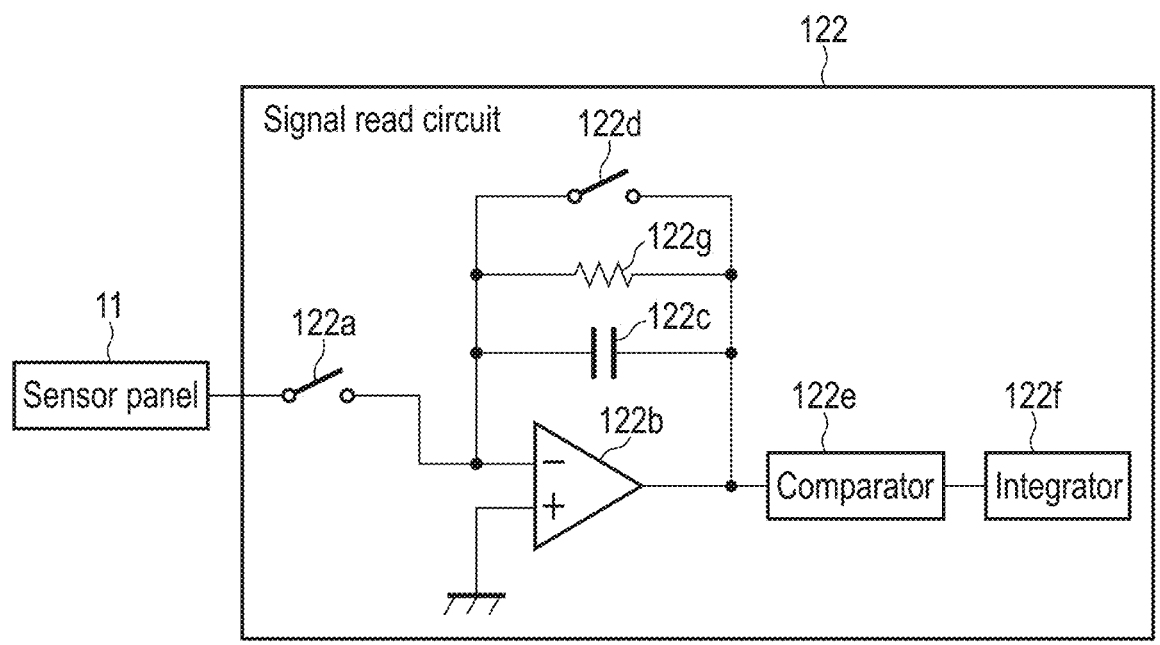
FIG. 11 is a diagram showing an example of the configuration of a signal read circuit including a resistor connected in parallel with a feedback capacitor and a reset switch.

Here, as shown in FIG. 11, for example, the signal read circuit 122 in this embodiment may include a resistor 122g connected in parallel to the feedback capacitor 122c and the reset switch 122d in order to prevent oscillation and remove low frequency components.

Note that, in the configuration including the resistor 122g as shown in FIG. 11, when the operation time for reading the charge from the sensor element by one sampling (that is, the charge read time by setting the read switch 122a in the OFF state) is long, the ratio of the amount of current flowing through the resistor 122g becomes large due to the difference in response characteristics of the resistance and the capacitance. As a result, an error occurs in the amount of charge to be converted into a digital signal.

On the other hand, in this embodiment, it is possible to shorten the operation time for reading the charge from the sensor element. Therefore, even with the configuration shown in FIG. 11, highly accurate digital signals (that is, digital signals with small errors) can be obtained.

Note that this embodiment is described in connection with the case where the read switch 122a is controlled based on the digital signal obtained by A/D-converting the analog signal according to the partially read charge (that is, it is determined whether or not the operation of reading the charge from the sensor element should be continued). But, the read switch 122a may be controlled based on the partially read charge (that is, the analog signal).

Third Embodiment

Next, the third embodiment will be described. The configurations and the like of the sensor module, sensor panel and sensor drive circuit according to this embodiment are similar to those of the first embodiment described above, and therefore it will be appropriately described with reference to FIGS. 1 to 3 and the like. Here, differences from those of the first embodiment described above will be mainly described.

This embodiment is different from the first embodiment described above in that the charge read time periods (that is, the integration intervals) in the operation of reading the charge from the sensor element are not constant.

Here, for example, the first embodiment described above has a configuration that the charge stored in the sensor element is read partially a plurality of times, and thus the feedback capacitor 122c included in the signal read circuit 122 can be made smaller than that of the comparative example of the first embodiment described above.

When the feedback capacitance 122c is thus configured to be smaller, it is possible to realize downsizing and cost reduction of the sensor drive circuit 12 (the signal read circuit).

However, when the feedback capacitance 122c is made small, the feedback capacitance 122c (the operational amplifier 122b) may be saturated by the charge read from the sensor element. Further, at the start of the operation of reading the charge from the sensor element, the efficiency of reading the charge is higher than that of the time of the completion of the reading operation.

Therefore, this embodiment adopts a configuration that the charge reading time (that is, the time period in which the read switch 122a is set in the ON state) is gradually increased, for example, from the start to the completion of the operation of reading the charge from the sensor element.

Hereinafter, with reference to FIG. 12, an example of the operation of the sensor drive circuit 12 (the operation of reading the charge from the sensor element) in this embodiment will be described. Here, the operation will be described in connection with the case of reading charges sequentially from the first sensor element including the sensor switch 1 and the second sensor element including the sensor switch 2 of a plurality of sensor elements arranged on the sensor panel 11.

Figure 12:
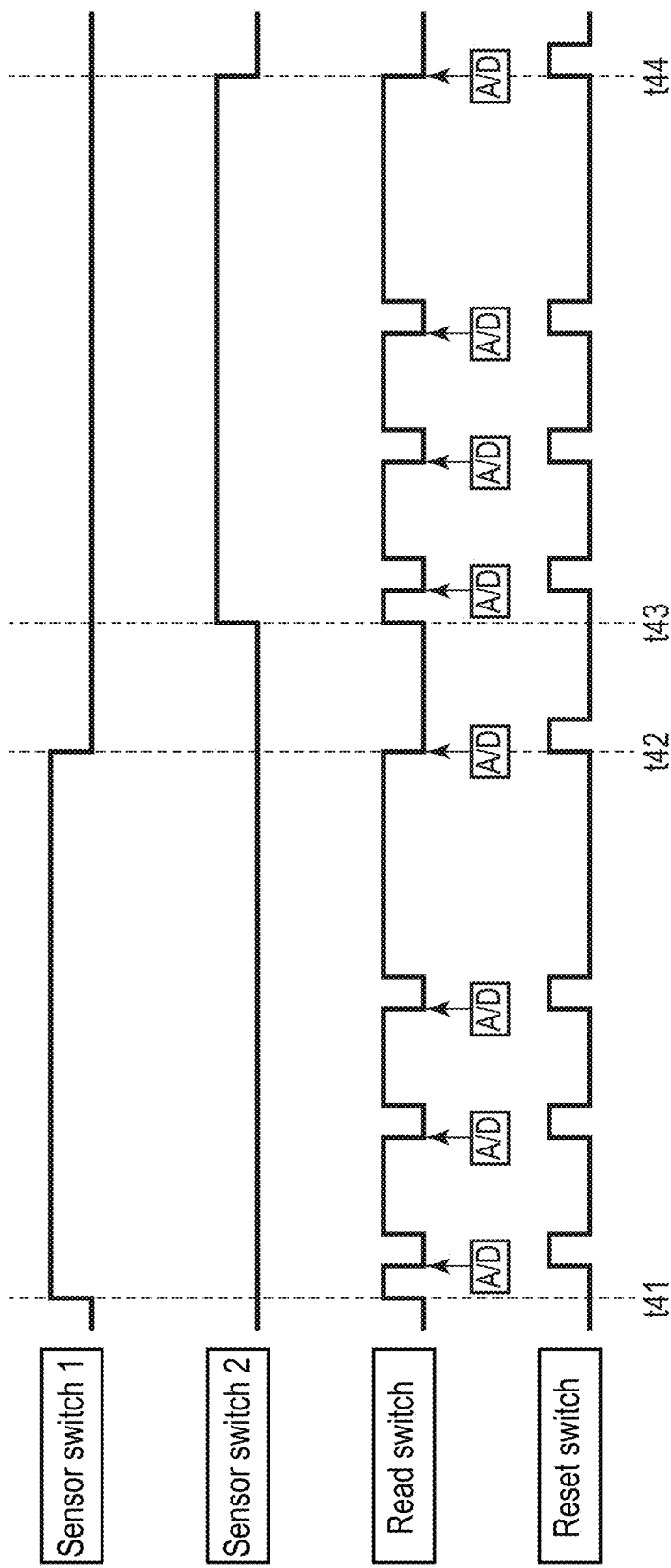
FIG. 12 is a diagram illustrating an example of the operation of a sensor drive circuit according to the third embodiment.

First, when the charge is read from the first sensor element, at a time t41 shown in FIG. 12, the gate drive circuit 121 supplies an on-voltage to the gate electrode of the sensor switch 1, so as to electrically connect between the source electrode and the drain electrode of the sensor switch 1. Further, at the time t41, the read switch 122a is set in the ON state.

Thus, the charge stored in the first sensor element (the charge holding capacitor provided in the first sensor element) can be input to the signal read circuit 122 via the sensor switch 1 and the read switch 122a, and the reading of the charge is started.

In this embodiment, the control circuit 123, as in the above-described first embodiment, sets the read switch 122a in the OFF state at time intervals shorter than the time in which the entire charge stored in the first sensor element is read, for example, after the read switch 122a is set in the ON state.

A part of the charge stored in the first sensor element thus read (that is, the partially read electric charge) is converted into a digital signal by the A/D converter.

When the above-described A/D conversion is completed, the integrator is reset by setting the reset switch 122d in the ON state, and the integrator is reset. When the reset of the integrator is completed, the reset switch 122d is set in the OFF state.

In this embodiment, a series of operations including partial read-out of charges from the first sensor element, the A/D conversion with respect to the charges and resetting of the integrator are repeated until the time in when the entire charge stored in the first sensor element can be read elapses. This operation is similar to that of the first embodiment described above, a detailed description thereof is omitted here.

Here, in this embodiment, the control circuit 123 controls the time for reading the charge from the first sensor element. Note that the time for reading the charge from the first sensor element is meant a time period during which the read switch 122a is kept in the ON state to read the charge from the first sensor element.

For example, in the operation of reading the charge from the first sensor element shown in FIG. 12, the partial charge reading from the first sensor element, the A/D conversion with respect to the charge, and the reset operation of the integrator are repeated four times.

In this case, the control circuit 123 controls the read switch 122a so that, for example, the second read time is longer than or equal to the first read time. Similarly, the control circuit 123 controls the read switch 122a so that, for example, the third read time is longer than or equal to the second read time. Further, the control circuit 123 controls the read switch 122a so that, for example, the fourth read time is longer than or equal to the third read time. In the example shown in FIG. 12, the second read time is the same as the third read time.

Let us assume that, as described above, the number of times the charge is read from the first sensor element and each read time are predetermined. In this case, the time period from the time t41 to the time t42 shown in FIG. 12 (the time when the reading of the charge from the first sensor element is completed) can be determined based on the number of times the charge is read from the first sensor element and each read time.

Note that the point where the digital signals output from the A/D converter during the operation of reading the charge from the first sensor element are integrated by the integrator 122f is similar to that of the first embodiment described above.

When the operation of reading the charge from the first sensor element is completed, the operation of reading the charge from the second sensor element is started. Here, the operation reading the charge from the second sensor element is similar to the operation of reading the charge from the first sensor element, and therefore a detailed description thereof will be omitted here. Note that the time t43 and the time t44 shown in FIG. 12 in the operation of reading the charge from the second sensor element correspond to the time t41 and the time t42 in the operation of reading the charge from the first sensor element.

As described above, in this embodiment, the read switch 122a is controlled so as to read a part (a first charge) of the charge stored in the sensor element, and the read switch 122a is controlled so as to read a part (a second charge) of the charge remaining in the sensor element after the charge is read. Here, the time (the second time) for reading the second charge is longer than or equal to the time (first time) for reading the first charge.

That is, in the operation of reading the charge from the sensor element in this embodiment, the read switch 122a is controlled so as to sample the charge in a short time at the beginning and sample the charge in a longer time increasingly as later.

In this embodiment, with such a configuration, even if the feedback capacitance 122c is made small as described above, the feedback capacitor 122c is prevented from being saturated, and thus the operation of reading the charge from the sensor element can be carried out efficiently.

Further, in this embodiment, the number of times of A/D conversion (that is, the number of times of integration) can be reduced, thus making it possible to suppress the noise components that may occur by the A/D conversion.

Note that this embodiment is described in connection with the case where each read time in the operation of reading the charge from the sensor element is predetermined, but each read time may be dynamically determined based on the digital signal output from the A/D converter immediately therebefore. More specifically, for example, the second read time shown in FIG. 12 may be determined based on the digital signal obtained by A/D-converting the analog signal according to the charge read in the first read time. This is also the case for the read times from the third time on.

In addition, this embodiment may be combined with the configuration described in the second embodiment (that is, the configuration for determining whether or not to continue the operation of reading the charge from the sensor element based on the digital signal obtained by A/D-converting the analog signal according to the partially read charge).

Hereinafter, the inventions according to the present embodiments will be additionally noted.

[C1]

A sensor device including:

a switch connected to a sensor element configured to store charge and provided to read the charge stored in the sensor element from the sensor element;

a control circuit configured to control the switch so as to partially and sequentially read the charge stored in the sensor element; and an A/D converter connected to the switch, which is configured to output a digital signal obtained by A/D-converting an analog signal according to the charge, for each charge partially read via the switch.

[C2]

The sensor device of item [C1], further including:

an integrator configured to integrate digital signals output from the A/D converter for each of the partially read charges.

[C3]

The sensor device of item [C1], wherein the control circuit is configured to control the switch based on a digital signal output from the A/D converter.

[C4]

The sensor device of item [C3], wherein the control circuit is configured to control the switch so as to read further charge from the sensor element when a value of the digital signal output from the A/D converter is no less than or equal to a predetermined value, and control the switch so as to start reading of charge from a sensor element different from the sensor element when the value of the digital signal output from the A/D converter is less than or equal to the predetermined value.

[C5]

The sensor device of item [C4], wherein the A/D converter includes:

an operational amplifier including a first input terminal connected to the sensor element and a second input terminal to which a predetermined potential is applied;

a feedback capacitor, a reset switch and a resistor connected in parallel between the first input terminal and an output terminal of the operational amplifier; and a comparator connected to the output terminal of the operational amplifier.

[C6]
The sensor device of item [C1], wherein
the control circuit is configured to control the switch so as to read a first charge, which is a part of the charge stored in the sensor element, and to read a second charge, which is a part of the charge remaining in the sensor element after the first electric charge is read out, and
the second time during which the second charge is read by controlling the switch is longer than or equal to the first time during which the first charge is read by controlling the switch.

[C7]
The sensor device of item [C6], wherein
the first time and the second time each are a predetermined time.

[C8]
The sensor device of item [C6], wherein
the second time is determined based on a digital signal obtained by A/D-converting the analog signal according to the first charge.

[C9]
An A/D conversion method executed by a sensor device including a switch connected to a sensor element configured to store charge and provided to read the charge stored in the sensor element from the sensor element, the method including:
controlling the switch to partially and sequentially read the charge stored in the sensor element; and
outputting a digital signal obtained by A/D-converting an analog signal according to the charge, for each charge partially read via the switch.

[C10]
The A/D conversion method of item [C9], further including:
integrating digital signals each output for each of the partially read charges.

[C11]
The A/D conversion method of item [C9], wherein
the controlling includes controlling the switch based on the output digital signal.

[C12]
The A/D conversion method of item [C11], wherein
the controlling includes:
controlling the switch to read more charge from the sensor element when a value of the output digital signal is not less than or equal to a predetermined value; and
controlling the switch to start reading charge from a sensor element different from the sensor element when the value of the output digital signal is less than or equal to the predetermined value.

[C13]
The A/D conversion method of item [C12], wherein
the outputting is executed by an A/D converter, and
the A/D converter includes:
an operational amplifier including a first input terminal connected to the sensor element and a second input terminal to which a predetermined potential is applied;
a feedback capacitor, a reset switch and a resistor connected in parallel between the first input terminal and an output terminal of the operational amplifier; and
a comparator connected to the output terminal of the operational amplifier.

[C14]
The A/D conversion method of item [C9], wherein
the controlling includes controlling the switch to read a first charge, which is a part of the charge stored in the sensor element, and further controlling the switch to read a second charge, which is a part of the charge remaining in the sensor element after the first charge is read, and
a second time during which the second charge is read by controlling the switch is longer than or equal to a first time during which the first charge is read by controlling the switch.

[C15]
The A/D conversion method of item [C14], wherein
the first time and the second time each are a predetermined time.

[C16]
The A/D conversion method of item [C14], wherein
the second time is determined based on a digital signal obtained by A/D-converting an analog signal according to the first charge.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A sensor device comprising:
a switch connected to a sensor element configured to store charge and provided to read the charge stored in the sensor element from the sensor element;
a control circuit configured to control the switch so as to partially and sequentially read the charge stored in the sensor element;
an A/D converter connected to the switch, which is configured to output a digital signal obtained by A/D-converting an analog signal according to the charge, for each charge partially read via the switch; and
an integrator configured to integrate digital signals output from the A/D converter for each of the partially read charges.

2. The sensor device of claim 1, wherein
the control circuit is configured to control the switch based on a digital signal output from the A/D converter.

3. The sensor device of claim 2, wherein
the control circuit is configured to control the switch so as to read further charge from the sensor element when a value of the digital signal output from the A/D converter is no less than or equal to a predetermined value, and control the switch so as to start reading of charge from a sensor element different from the sensor element when the value of the digital signal output from the A/D converter is less than or equal to the predetermined value.

4. The sensor device of claim 3, wherein
the A/D converter comprises:
an operational amplifier comprising a first input terminal connected to the sensor element and a second input terminal to which a predetermined potential is applied;
a feedback capacitor, a reset switch and a resistor connected in parallel between the first input terminal and an output terminal of the operational amplifier; and
a comparator connected to the output terminal of the operational amplifier.

5. The sensor device of claim 1, wherein
the control circuit is configured to control the switch so as to read a first charge, which is a part of the charge stored in the sensor element, and to read a second charge, which is a part of the charge remaining in the sensor element after the first electric charge is read out, and the second time during which the second charge is read by controlling the switch is longer than or equal to the first time during which the first charge is read by controlling the switch.

6. The sensor device of claim 5, wherein
the first time and the second time each are a predetermined time.

7. The sensor device of claim 5, wherein
the second time is determined based on a digital signal obtained by A/D-converting the analog signal according to the first charge.

8. An A/D conversion method executed by a sensor device comprising a switch connected to a sensor element configured to store charge and provided to read the charge stored in the sensor element from the sensor element, the method comprising:
controlling the switch to partially and sequentially read the charge stored in the sensor element;
outputting a digital signal obtained by A/D-converting an analog signal according to the charge, for each charge partially read via the switch; and
integration digital signals each output for each of the partially read charges.

9. The A/D conversion method of claim 8, wherein
the controlling comprises controlling the switch based on the output digital signal.

10. The A/D conversion method of claim 9, wherein
the controlling comprises:
controlling the switch to read more charge from the sensor element when a value of the output digital signal is not less than or equal to a predetermined value; and
controlling the switch to start reading charge from a sensor element different from the sensor element when the value of the output digital signal is less than or equal to the predetermined value.

11. The A/D conversion method of claim 10, wherein
the outputting is executed by an A/D converter, and
the A/D converter comprises:
an operational amplifier comprising a first input terminal connected to the sensor element and a second input terminal to which a predetermined potential is applied;
a feedback capacitor, a reset switch and a resistor connected in parallel between the first input terminal and an output terminal of the operational amplifier; and
a comparator connected to the output terminal of the operational amplifier.

12. The A/D conversion method of claim 8, wherein
the controlling comprises controlling the switch to read a first charge, which is a part of the charge stored in the sensor element, and further controlling the switch to read a second charge, which is a part of the charge remaining in the sensor element after the first charge is read, and
a second time during which the second charge is read by controlling the switch is longer than or equal to a first time during which the first charge is read by controlling the switch.

13. The A/D conversion method of claim 12, wherein
the first time and the second time each are a predetermined time.

14. The A/D conversion method of claim 12, wherein
the second time is determined based on a digital signal obtained by A/D-converting an analog signal according to the first charge.

* * * * *